(12) United States Patent
Yao

(10) Patent No.: US 9,977,342 B2
(45) Date of Patent: May 22, 2018

(54) LITHOGRAPHY STEPPER ALIGNMENT AND CONTROL METHOD

(71) Applicant: CSMC TECHNOLOGIES FAB2 CO., LTD., Wuxi New District (CN)

(72) Inventor: Zhenhai Yao, Wuxi New District (CN)

(73) Assignee: CSMC TECHNOLOGIES FAB2 CO., LTD., Wuxi New District, Jiangsu (CN)

( * ) Notice: Subject to any disclaimer, the term of this patent is extended or adjusted under 35 U.S.C. 154(b) by 0 days. days.

(21) Appl. No.: 15/315,168

(22) PCT Filed: Jun. 26, 2015

(86) PCT No.: PCT/CN2015/082523
§ 371 (c)(1),
(2) Date: Nov. 30, 2016

(87) PCT Pub. No.: WO2015/197023
PCT Pub. Date: Dec. 30, 2015

(65) Prior Publication Data
US 2017/0192363 A1    Jul. 6, 2017

(30) Foreign Application Priority Data

Jun. 26, 2014 (CN) .......................... 2014 1 0295485

(51) Int. Cl.
*G03F 9/00* (2006.01)
*G03F 7/20* (2006.01)

(52) U.S. Cl.
CPC ...... *G03F 7/70633* (2013.01); *G03F 7/70775* (2013.01); *G03F 9/7003* (2013.01); *G03F 9/7046* (2013.01); *G03F 9/7069* (2013.01)

(58) Field of Classification Search
CPC .... G03F 9/7046; G03F 9/7049; G03F 9/7073; G03F 9/7003; G03F 7/70633; G03F 7/70775; G03F 7/70483; G03F 7/70525
See application file for complete search history.

(56) References Cited

U.S. PATENT DOCUMENTS

| 2008/0057418 | A1 | 3/2008 | Seltmann et al. |
| 2013/0258306 | A1 | 10/2013 | Huang et al. |
| 2014/0212817 | A1* | 7/2014 | Habets ................ G03F 7/70633 430/319 |

FOREIGN PATENT DOCUMENTS

| CN | 101435998 A | 5/2009 |
| CN | 102955379 A | 3/2013 |

(Continued)

OTHER PUBLICATIONS

English Translation of International Search Report for International Application No. PCT/CN2015/082523, dated Sep. 30, 2015 (2 pages).

(Continued)

*Primary Examiner* — Michelle M Iacoletti
(74) *Attorney, Agent, or Firm* — Kagan Binder, PLLC

(57) ABSTRACT

A lithography stepper alignment and control method, comprising: providing a test template having a plurality of field sizes, and deriving a set of overlay values for each field size (S1); calculating a set of compensation amounts for the overlay value of each field size (S2); and, comparing a set of estimated alignment compensation values for a product with each compensation amount for each field size, selecting as the product alignment compensation values the set of compensation amounts of a field size closest to the set of estimated alignment compensation values, and, using the product alignment compensation values to perform alignment compensation on said product (S3).

6 Claims, 3 Drawing Sheets

(56) References Cited

FOREIGN PATENT DOCUMENTS

CN   103105741 A   5/2013
WO   2011087129 A1   7/2011

OTHER PUBLICATIONS

Deng et al., U.S. Appl. No. 14/902,516, International Application Filing Date Jul. 29, 2014.
Zhong et al., U.S. Appl. No. 14/902,517, International Application Filing Date Jul. 22, 2014.
Zhang et al., U.S. Appl. No. 14/902,519, International Application Filing Date Aug. 19, 2014.
Wang et al., U.S. Appl. No. 14/902,302, International Application Filing Date Sep. 2, 2014.
Zhang et al., U.S. Appl. No. 15/023,049, International Application Filing Date Dec. 2, 2014.
Jing et al., U.S. Appl. No. 15/023,057, International Application Filing Date Dec. 4, 2014.
Hu et al., U.S. Appl. No. 15/119,249, International Application Filing Date May 8, 2015.
Wang et al., U.S. Appl. No. 15/119,289 International Application Filing Date April 29, 2015.
Qian et al., U.S. Appl. No. 15/119,311, International Application Filing Date May 6. 2015.
Zhang et al., U.S. Appl. No. 15/308,574, International Application Filing Date May 4, 2015.
Rao et al., U.S. Appl. No. 15/309,744, International Application Filing Date Jul. 10, 2014.
Hu et al., U.S. Appl. No. 15/312,146, International Application Filing Date May 5, 2015.

\* cited by examiner

US 9,977,342 B2

LITHOGRAPHY STEPPER ALIGNMENT AND CONTROL METHOD

FIELD OF THE INVENTION

The present invention relates to a field of semiconductor technology, and more particularly relates to an aligning and monitoring method of a photolithography stepper.

BACKGROUND OF THE INVENTION

As a photolithography stepper ages, a distortion of the photolithography stepper becomes non-linear, in other words, different visual fields shows different amounts of magnification, rotation, and offset X/Y. In daily monitoring, the largest visual field is usually selected. The visual field range of photolithography templates produced by chip design companies is very broad, which determines the field size differences between different products of wafer factories, resulting in an alignment difficulty during the processing of the wafer, and is likely to shift when being aligned.

In order to address the above defects, a conventional solution is to adjust the lens of the photolithography stepper, and improve the distortion. However, the improvement is quite limited, while the cost is expensive, and the distortion may still go worse over time. Alternatively, it is also a solution to perform compensation according to measured overlay values of different products. Nevertheless, products of wafer foundries renew fast, and have many varieties; such solution requires a lot of manpower, which is ineffective. Moreover, during a first processing of a new product, the compensation value is unable to be pre-estimated, sacrificing the alignment accuracy and circulation speed of the new product when reworking is needed for out of specification.

Referring to FIG. 1, FIG. 1 is an aligning and monitoring view of a conventional photolithography stepper. When performing aligning and monitoring according to such method, i.e., selecting a visual field 1 to perform monitoring, in which an alignment measurement pattern 11 is put at four corners of the visual field 1, and performing compensations such as rotation, magnification, and offset according to the overlay value measured by the alignment measurement pattern 11 at the four corners. Such method can perform accurate compensations to the product close to its visual field 1, but when the visual field of the product deflects the selected visual field of the monitor, misalignment is likely to occur. In addition, the conventional method is expensive, ineffective, and difficult to perform alignment control.

SUMMARY OF THE INVENTION

Accordingly, it is necessary to provide an aligning and monitoring method of a photolithography stepper, so as to improve the aligning and monitoring without increasing the cost.

A method for aligning and monitoring a photolithography stepper includes: providing a test template having a plurality of visual fields, and deriving a set of overlay values based on each visual field; calculating a set of compensation amounts according to the overlay value of each visual field; and comparing a set of estimated alignment compensation values of a product with the compensation amount of each visual field, selecting a set of compensation amounts of a visual field which is closest to the set of estimated alignment compensation values as the alignment compensation value of the product, and performing an alignment compensation on the product using the alignment compensation value of the product.

In the present disclosure, a plurality of visual fields are monitored. If the distortion of the lens is non-linear, the compensation amounts such as rotation, magnification and offset calculated according to the measured overlay values of different visual fields will be different. By manufacturing a test template, and calculating a set of compensation amounts of different visual fields respectively, the alignment compensation value of the product can be selected according to the set of compensation amounts of a visual field which is closest to the visual field of the product, thereby accurately distinguishing the alignment compensation value of the product, and remedying the influence caused by distortion. The present disclosure can be adapted to the products with all kinds of visual fields, and an accurate compensation can be achieved regardless the size of the visual field. In addition, the estimated alignment compensation value can be provided before processing, thus greatly reducing the probability of the occurrence of alignment offset. The present disclosure can effectively improve the alignment control without increasing the cost and the manpower.

BRIEF DESCRIPTION OF THE DRAWINGS

To illustrate the technical solutions according to the embodiments of the present invention or in the prior art more clearly, the accompanying drawings for describing the embodiments or the prior art are introduced briefly in the following. Apparently, the accompanying drawings in the following description are only some embodiments of the present invention, and persons of ordinary skill in the art can derive other drawings from the accompanying drawings without creative efforts.

DETAILED DESCRIPTION OF THE EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art.

Figure 1:
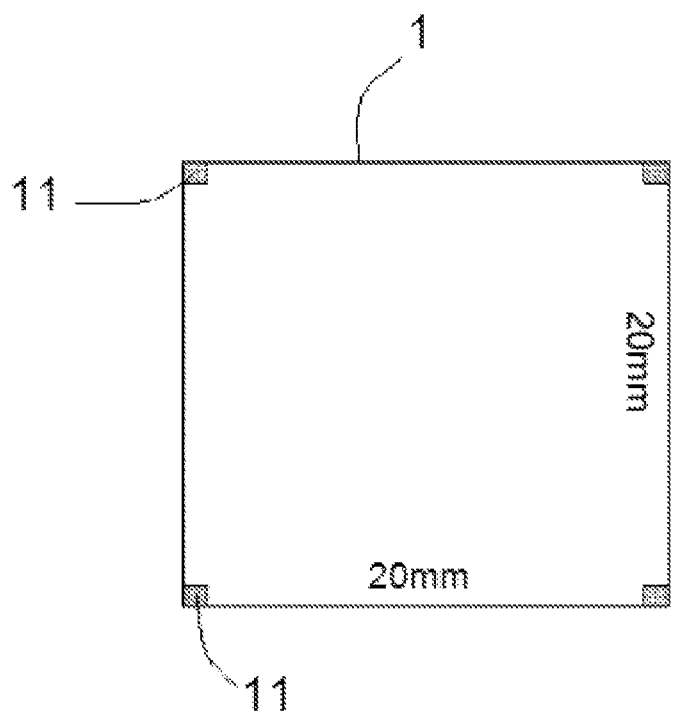
FIG. 1 is an aligning and monitoring view of a conventional photolithography stepper.
Figure 2:
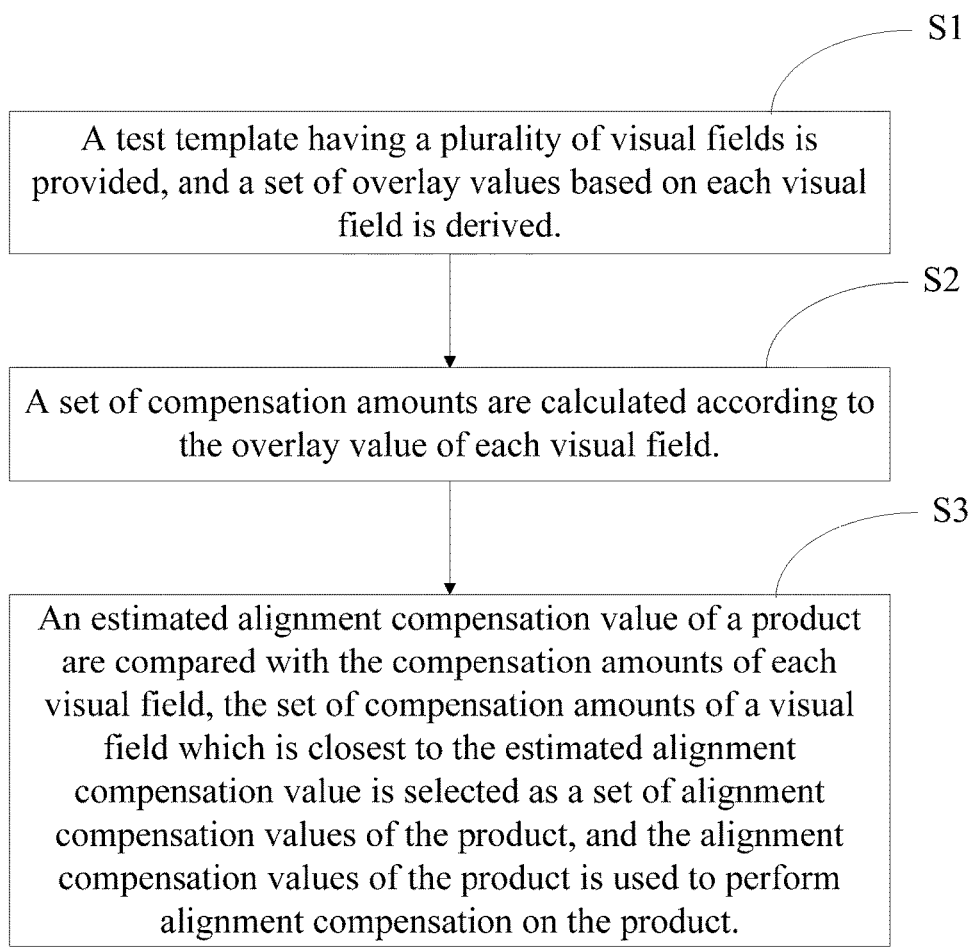
FIG. 2 is a flow chart of a method for aligning and monitoring a photolithography stepper in accordance with an embodiment.
Figure 3:
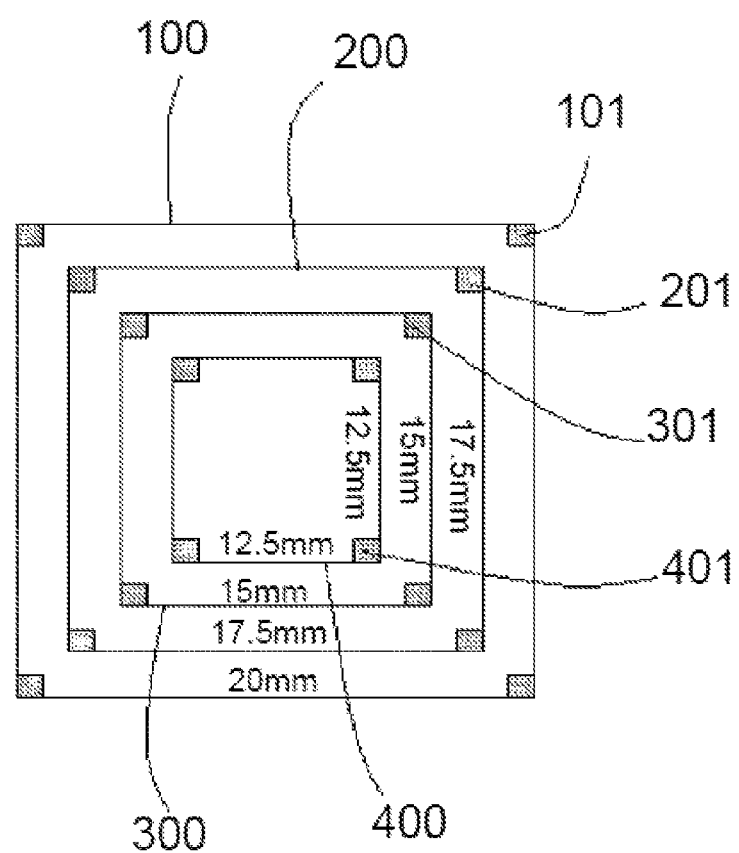
FIG. 3 is an aligning and monitoring view of a photolithography stepper in accordance with an embodiment.

Referring to FIG. 2, FIG. 2 is a flow chart of a method for aligning and monitoring a photolithography stepper in accordance with an embodiment. Referring also to FIG. 3, FIG. 3 is an aligning and monitoring view of a photolithography stepper in accordance with an embodiment. The aligning and monitoring method of a photolithography stepper includes the following steps:

In step S1, a test template having a plurality of visual fields is provided, and a set of overlay values based on each visual field is derived. Referring to FIG. 3, in the illustrated embodiment, the plurality of visual fields includes a first visual field 100, a second visual field 200, a third visual field 300, and a fourth visual field 400. The first visual field 100 has a size of 20 mm×20 mm, the second visual field 200 has a size of 17.5 mm×17.5 mm, the third visual field 300 has a size of 15 mm×15 mm, and the fourth visual field 400 has a size of 12.5 mm×12.5 mm. Alignment measurement patterns 101, 201, 301, and 401 are respectively located at four corners of the first visual field 100, the second visual field 200, the third visual field 300, and the fourth visual field 400, and overlay values are measured according to the alignment measurement patterns at the four corners of each visual field. In other embodiments, the number of the plurality of visual fields is more than or equals to 2. The specific number can be based on actual situations. In other embodiments, the size of each visual field is also unlimited, which can be based on actual situations.

In step S2, a set of compensation amounts are calculated according to the overlay value of each visual field. Further referring to FIG. 3, a set of compensation amounts of the first visual field 100 having a size of 20 mm×20 mm are respectively calculated, a set of compensation amounts of the second visual field 200 having a size of 17.5 mm×17.5 mm are respectively calculated, a set of compensation amounts of the third visual field 300 having a size of 15 mm×15 mm are respectively calculated, and a set of compensation amounts of the fourth visual field 400 having a size of 12.5 mm×12.5 mm are respectively calculated. The alignment compensation values of the product can perform compensation according to the set of compensation amounts of a visual field which is closest to the visual field of the product, thereby accurately distinguishing the alignment compensation values of the product, and remedying the effect of distortion. In the present disclosure, the compensation amounts include but not limit to rotation, magnification and offset. In the present disclosure, the product includes but not limits to a wafer.

In step S3, a set of estimated alignment compensation values of a product are compared with the compensation amounts of each visual field, the set of compensation amounts of a visual field which is closest to the set of estimated alignment compensation values is selected as a set of alignment compensation values of the product, and the alignment compensation values of the product is used to perform alignment compensation on the product. Further referring to FIG. 3, the four visual fields shown in FIG. 3 are selected as example to explain the alignment compensation of the product. Suppose a photolithography stepper only measures four corners daily. First, the compensation amounts of the first visual field 100 having a size of 20 mm×20 mm are respectively calculated, the four corners of the first visual field 100 are respectively corresponding to an alignment measurement patterns 101, an overlay value is calculated according to each alignment measurement patterns 101, and the four overlay values are marked as (m1, n1), (m2, n2), (m3, n3), and (m4, n4) for a set. The marks m1, m2, m3, and m4 are values of X axis, while the marks n1, n2, n3, and n4 are values of Y axis. Therefore, the offset X of the first visual field of the photolithography stepper is (m1+m2+m3+m4)/4, while the offset Y of the first visual field of the photolithography stepper is (n1+n2+n3+n4)/4. Then compensation amounts of the second visual field 200 having a size of 17.5 mm×17.5 mm, the third visual field 300 having a size of 15 mm×15 mm, and the fourth visual field 400 having a size of 12.5 mm×12.5 mm are respectively calculated. When the set of estimated alignment compensation values is simultaneously close to two sets of compensation amounts, the set of compensation amounts of a visual field which is close to the size of the product can be selected as the alignment compensation values of the product.

In the present disclosure, a plurality of visual fields are monitored. If the distortion of the lens is non-linear, the compensation amounts such as rotation, magnification and offset calculated according to the measured overlay values of different visual fields will be different. By manufacturing a test template, and calculating a set of compensation amounts of different visual fields respectively, the alignment compensation value of the product can be selected according to the set of compensation amounts of a visual field which is closest to the visual field of the product, thereby accurately distinguishing the alignment compensation value of the product, and remedying the influence caused by distortion. The present disclosure can be adapted to the products with all kinds of visual fields, and an accurate compensation can be achieved regardless the size of the visual field. In addition, the estimated alignment compensation value can be provided before processing, thus greatly reducing the probability of the occurrence of alignment offset. The present disclosure can effectively improve the alignment control without increasing the cost and the manpower.

Although the present invention has been described with reference to the embodiments thereof and the best modes for carrying out the present invention, it is apparent to those skilled in the art that a variety of modifications and changes may be made without departing from the scope of the present invention, which is intended to be defined by the appended claims.

What is claimed is:

1. An aligning and monitoring method of a photolithography stepper, comprising:
   providing a test template having a plurality of visual fields, and deriving a set of overlay values based on each visual field;
   calculating a set of compensation amounts according to the overlay value of each visual field; and
   comparing a set of estimated alignment compensation values of a product with the compensation amounts of each visual field, selecting a set of compensation amounts of a visual field which is closest to the set of estimated alignment compensation values as the alignment compensation value of the product, and performing an alignment compensation on the product using the alignment compensation value of the product.

2. The method according to claim 1, wherein the plurality of visual fields comprises a first visual field, a second visual field, a third visual field, and a fourth visual field; the first visual field has a size of 20 mm×20 mm, the second visual field has a size of 17.5 mm×17.5 mm, the third visual field has a size of 15 mm×15 mm, and the fourth visual field has a size of 12.5 mm×12.5 mm.

3. The method according to claim 1, wherein each visual field comprises four alignment measurement patterns, and the four alignment measurement patterns are located at four corners of each visual field, respectively; the overlay values are measured according to the alignment measurement patterns at the four corners of each visual field.

4. The method according to claim 1, wherein the compensation amounts comprise at least one amount selected from the group consisting of rotation, magnification, and offset.

5. The method according to claim 1, wherein the product is a wafer.

6. The method according to claim 1, further comprising: selecting a set of compensation amounts of a visual field which is closer to the size of the product as the alignment compensation value of the product, when the set of estimated alignment compensation values is simultaneously close to two sets of compensation amounts.

\* \* \* \* \*